United States Patent [19]
Hayashi et al.

[11] Patent Number: 5,975,012
[45] Date of Patent: Nov. 2, 1999

[54] DEPOSITION APPARATUS

[75] Inventors: Senichi Hayashi, Hiratsuka; Nobumasa Suzuki, Yokohama, both of Japan

[73] Assignee: Canon Kabushiki Kaisha, Tokyo, Japan

[21] Appl. No.: 08/736,681

[22] Filed: Oct. 25, 1996

[30]  Foreign Application Priority Data

Oct. 27, 1995 [JP] Japan .................................. 7-280431

[51] Int. Cl.⁶ ................................................... H05H 1/00
[52] U.S. Cl. ........................ 118/723 MW; 118/723 MP; 204/298.38
[58] Field of Search ................................. 118/723 MW, 118/723 MP; 204/298.06, 298.08, 298.12, 298.34, 298.38; 156/345

[56]  References Cited

U.S. PATENT DOCUMENTS

| | | | |
|---|---|---|---|
| 4,776,918 | 10/1988 | Otsubo et al. | 156/345 |
| 4,919,077 | 4/1990 | Oda et al. | 118/723 E |
| 5,294,320 | 3/1994 | Somekh et al. | 204/298.08 X |
| 5,433,787 | 7/1995 | Suzuki et al. | 118/723 |
| 5,585,148 | 12/1996 | Suzuki et al. | 497/572 |

*Primary Examiner*—Thi Dang
*Attorney, Agent, or Firm*—Fitzpatrick, Cella, Harper & Scinto

[57]  ABSTRACT

A deposition apparatus including a deposition chamber containing therein a holder for holding a substrate and an electrode holding a sputtering target, a device for applying electrical power to the electrode, a gas supplying device for supplying gas to the deposition chamber, a evacuating device for evacuating the deposition chamber, and a microwave supplying device disposed around the deposition chamber. By virtue of such a construction, the deposition apparatus allows the target to be used with high efficiency and the ions to be maintained at a high density and low energy.

7 Claims, 6 Drawing Sheets

DEPOSITION APPARATUS

BACKGROUND OF THE INVENTION

1. Field of the Invention

The present invention broadly relates to a deposition apparatus.

2. Description of the Related Art

The direct current sputtering apparatus is known as a type of deposition apparatus.

Figure 5:
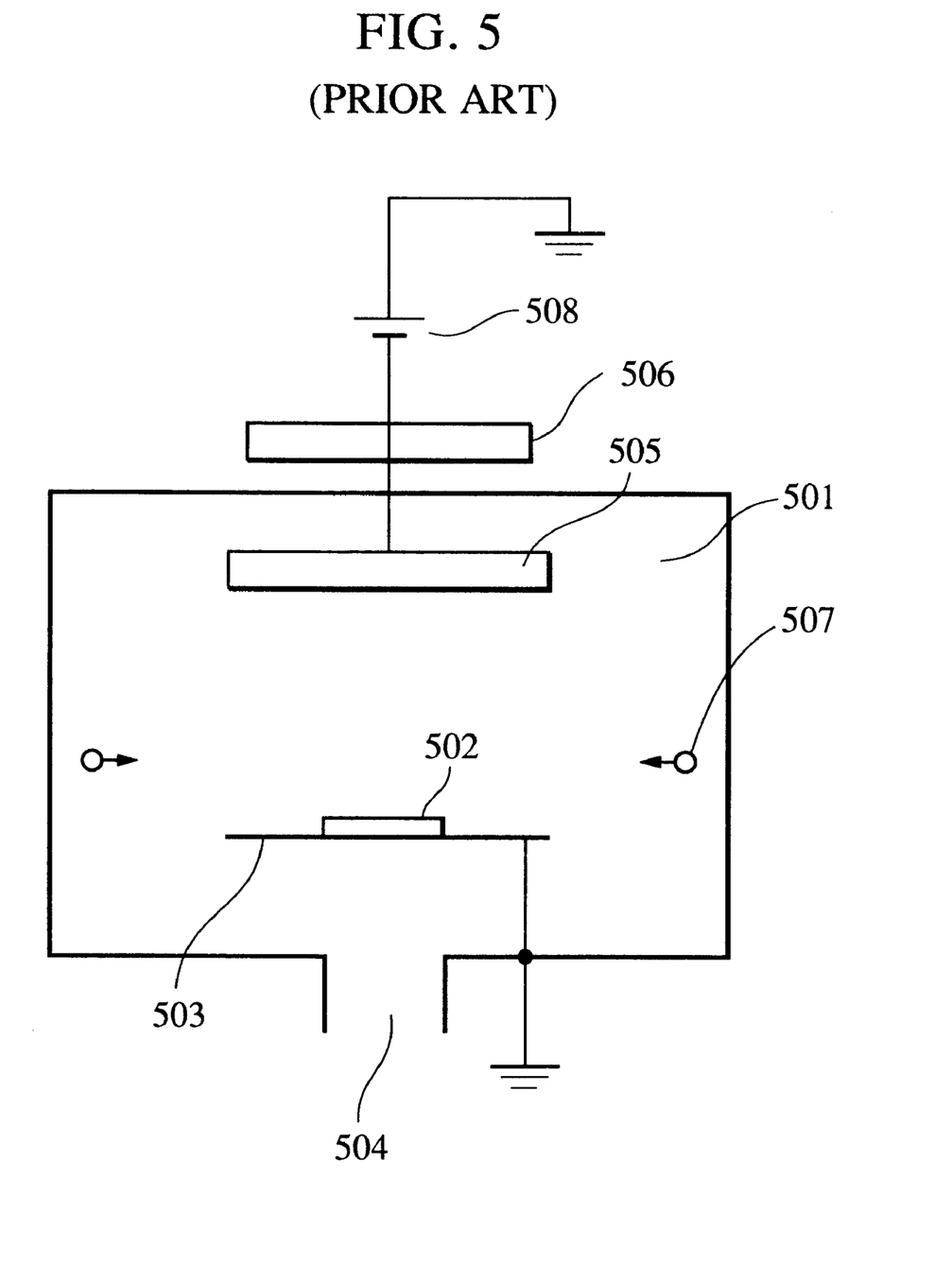
FIG. 5 is a cross sectional view of a conventional deposition apparatus.

FIG. 5 is a cross sectional view of a direct current sputtering apparatus, in which reference numeral 501 denotes a deposition chamber, reference numeral 502 denotes a substrate, reference numeral 503 denotes a supporting member, reference numeral 504 denotes an exhaust tube, reference numeral 505 denotes a target electrode, reference numeral 506 denotes a magnet for generating a magnetron magnetic field, reference numeral 507 denotes a gas-introducing tube, and reference numeral 508 denotes a direct current power supply.

The pressure in the deposition chamber 501 is reduced down to $10^{-6}$ Torr through an exhaust system (not shown). Then, gas is introduced into the deposition chamber 501 from the gas-introducing tube 507, so as to keep the pressure in the deposition chamber 501 at a predetermined value. Thereafter, voltage is applied to the target 505 from the direct current power supply 508 to generate plasma which strikes the target, whereby a film accumulates on the surface of the substrate 502.

The above-described conventional deposition apparatus, however, has a problem in that the target cannot be used with high efficiency because of erosion of the target caused by a magnetron magnetic field.

In addition, since the ions cannot be maintained at a high density and low energy, it is difficult to achieve deposition of a highly-crystalline, polycrystalline Si, or $MgF_2$ having a low absorption of light.

Accordingly, an object of the present invention is to provide a deposition apparatus which overcomes the prior art problems, allows the target to be used efficiently, and maintains the ions at a high density and low energy.

SUMMARY OF THE INVENTION

A characteristic of the present invention is the use of a microwave supplying means disposed outside the deposition chamber as means to generate plasma. An endless circular waveguide is used for the aforementioned microwave supplying means in order to allow efficient use of the target, since the entire target is sputtered uniformly by ring-shaped plasma that is generated along the endless circular waveguide.

DESCRIPTION OF THE PREFERRED EMBODIMENTS

Figure 1:
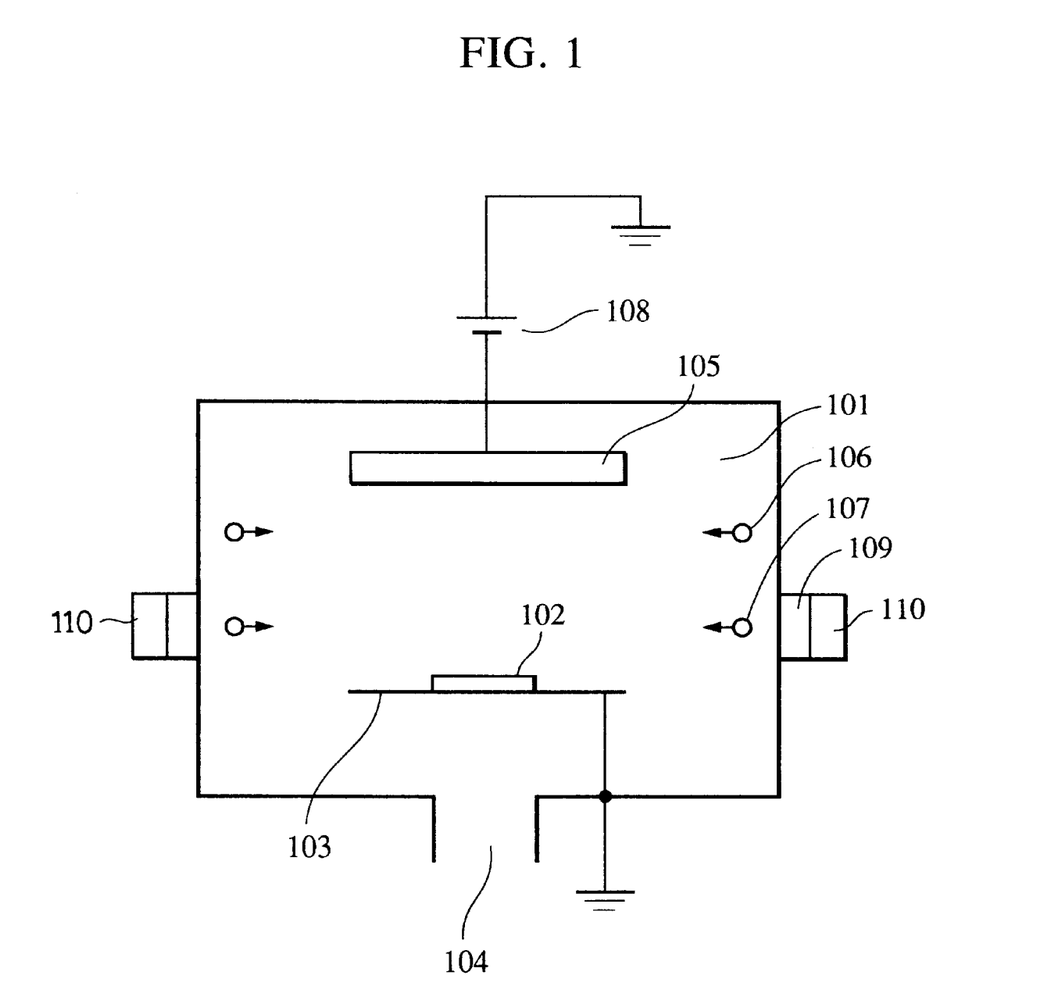
FIG. 1 is a cross sectional view of a first embodiment of a deposition apparatus in accordance with the present invention.

FIG. 1 is a cross sectional view of the first embodiment of the deposition apparatus of the present invention, in which a deposition chamber 101 contains therein a supporting member or holder 103 for placing thereon a substrate 102 to be subjected to deposition, an exhaust tube 104, a target electrode 105, a first gas-introducing tube 106, and a second gas-introducing tube 107. The target electrode 105 is connected to a direct current power supply 108. A waveguide 110 is disposed around the deposition chamber 101, around a space formed between said target and said holder, via a dielectric 109.

Figure 6:
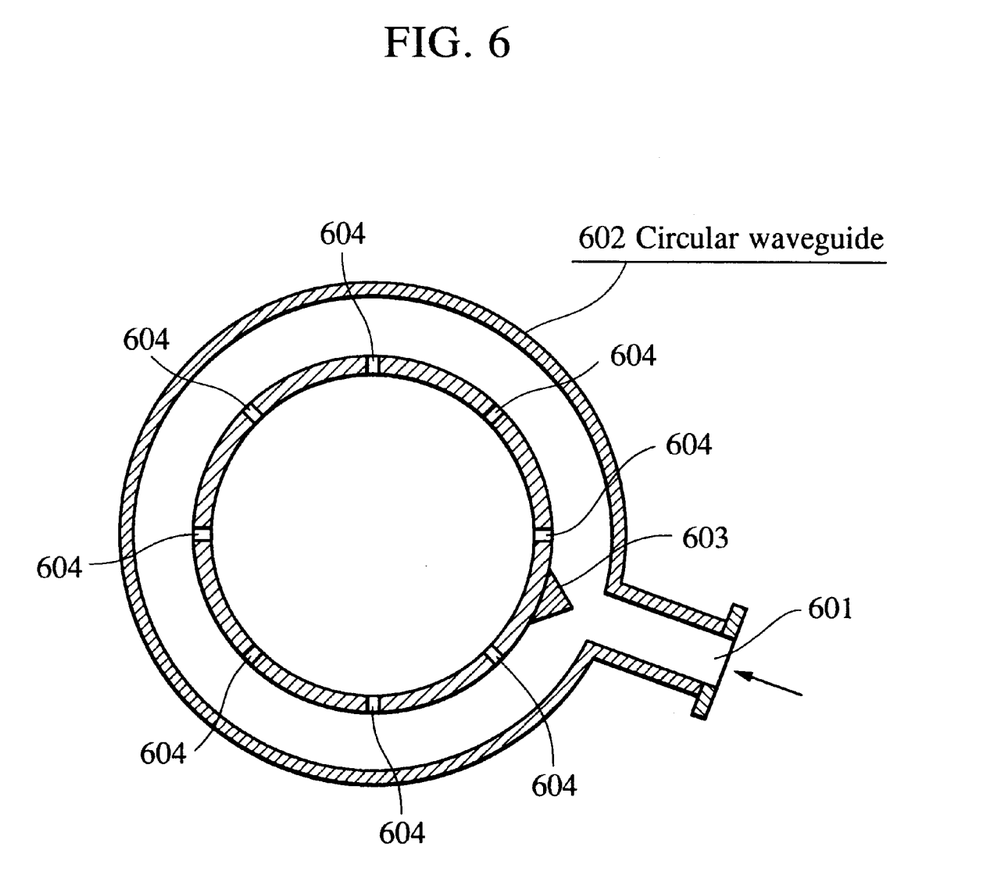
FIG. 6 is a cross sectional view of an endless waveguide with slots, with the endless waveguide serving as a microwave introducing means in the present invention.

FIG. 6 illustrates a structure of a preferable waveguide used in the present invention. The circular waveguide 602 comprises an inlet 601, a distribution block 603, and slots 604.

Microwaves are supplied through the above-described waveguide as follows. When a required electrical power is supplied from a microwave power supply (not shown) into the circular waveguide 602 from the inlet 601 thereof, the distribution block 603 distributes the microwaves in two directions. The distributed microwaves are transmitted through the circular waveguide 602, and interfere with each other, thereby generating strong electrical field portions (or loops) every ½ wavelength in the waveguide 602. The microwaves are introduced into the deposition chamber from the slots 604 formed in correspondence with the loops.

The effects produced by the interference allows :he intensity of the microwaves to be maintained at a high level even in regions far removed from the inlet 601, so that uniform microwaves can be introduced into the waveguide 602. The closer the strengths of the intensity of the microwaves of the two distributed microwaves are, the greater the interference.

In FIG. 1, the gas introducing means include a first gas-introducing tube 106, and, when necessary, a second gas-introducing tube 107. The first gas-introducing tube 106 is used to introduce sputtering gas (or gas primarily contributing to sputtering) near the target, whereas the second gas-introducing tube 107 is used to introduce reactive gas that reacts with the particles sputtered from the target along the endless circular waveguide, during reactive sputtering. The second gas-introducing tube 107 is made of dielectric material that does not affect microwave introduction.

Figure 2:
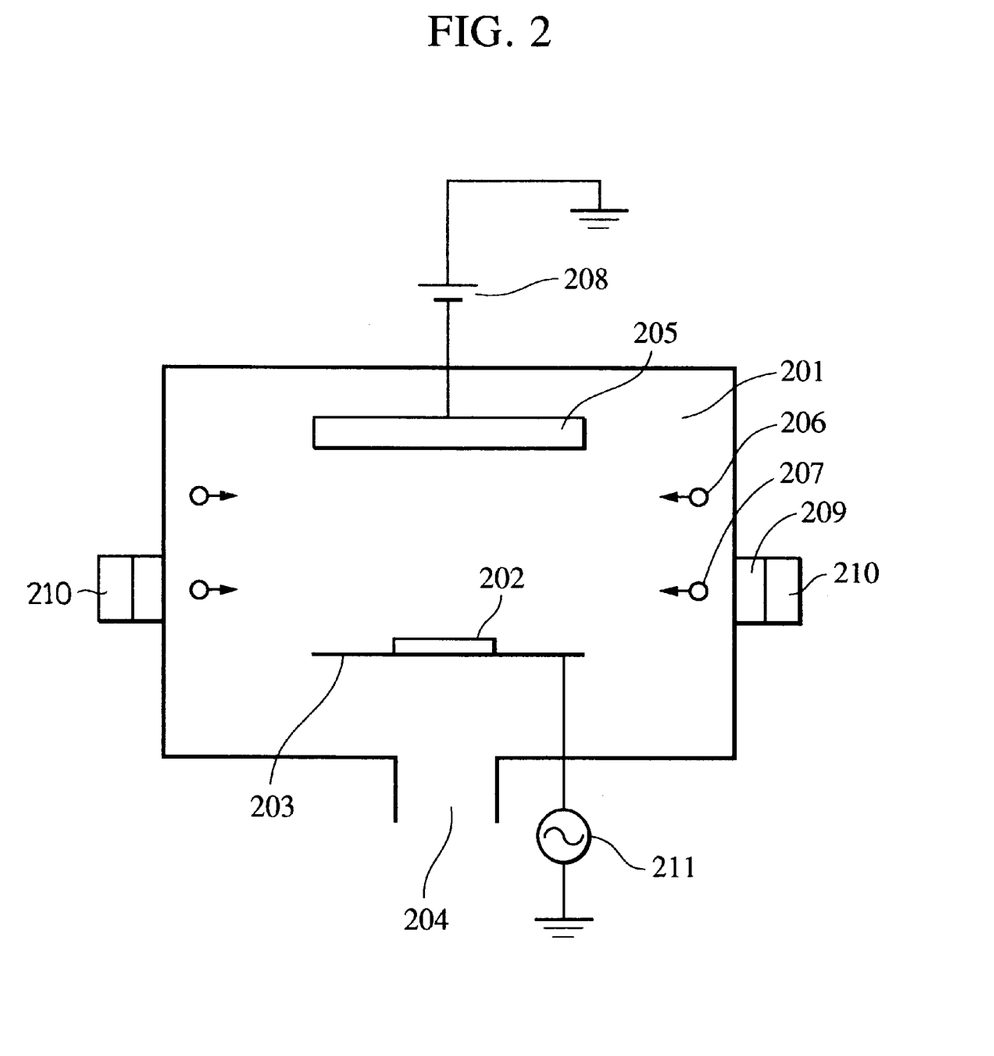
FIG. 2 is a cross sectional view of a second embodiment of a deposition apparatus in accordance with the present invention.
Figure 3:
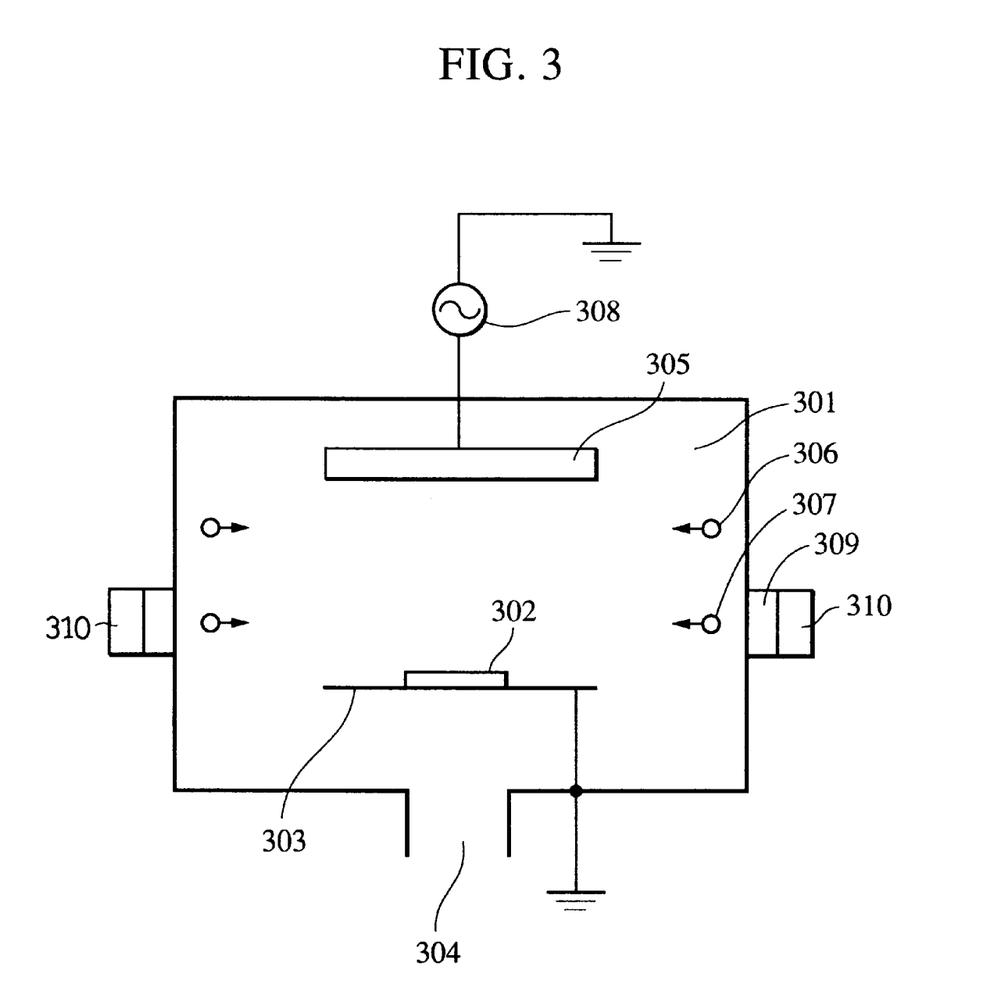
FIG. 3 is a cross sectional view of a third embodiment of a deposition apparatus in accordance with the present invention.
Figure 4:
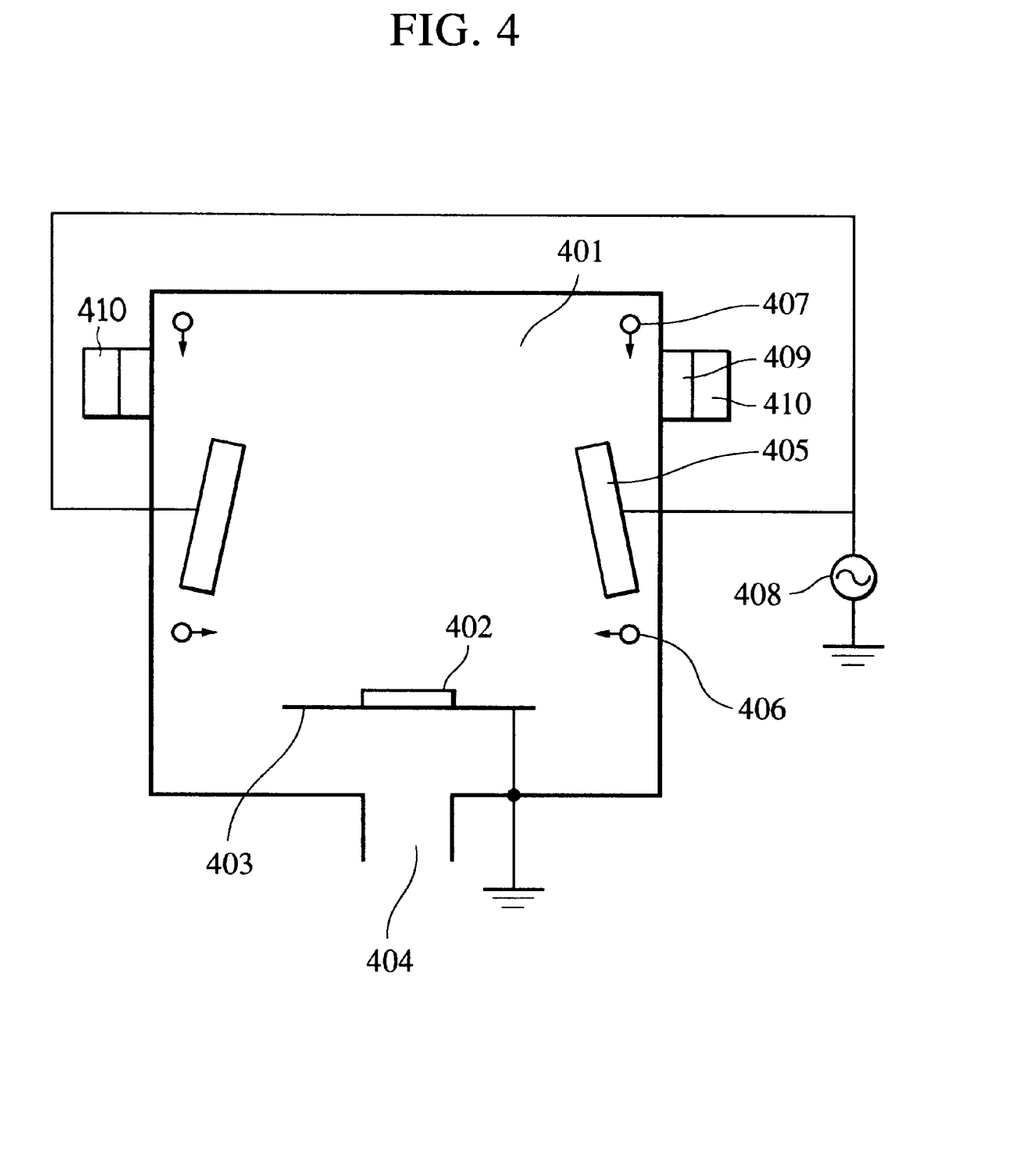
FIG. 4 is a cross sectional view of a fourth embodiment of a deposition apparatus in accordance with the present invention.

Analogous reference numbers are used in FIGS. 2 to 4.

A description will now be given of a deposition method using the deposition apparatus of FIG. 1.

The pressure in the deposition chamber 101 is reduced down to $10^{-6}$ Torr through an exhaust system (not shown). An acceptable range for initial pressure is $10^{-6}$ to $10^{-9}$ Torr. Then, gas is introduced into the deposition chamber 101 from the gas-introducing tubes 106 and 107, so as to keep the pressure in the deposition chamber 101 at a desired value. A suitable pressure range is $1 \times 10^{-4}$ to $5 \times 10^{-3}$ Torr. Microwaves are, then, introduced into the deposition chamber 101 from the waveguide 110 via the dielectric 109 in order to generate plasma. An applicable range of the microwave frequency is 300 MHz to 30 GHz. Thereafter, application of voltage to the target electrode 105 from the direct current power supply 108 causes sputtering to take place, whereby a film is deposited onto the surface of the substrate 102. An acceptable voltage range is 10 to 200 V. DC 100 V is applied to the target and/or substrate in the Examples.

Using the deposition apparatus according to the present invention and selecting a proper gas and target allows various types of films to be deposited. The various types of films include insulation films, semiconductor films, and conductive films. Examples of insulation films include silicon nitride films, silicon oxide films, tantalum oxide films, titanium oxide films, titanium nitride films, aluminum oxide films, aluminum nitride films, and magnesium fluoride films. Examples of semiconductor films include a-Si films, poly-Si films, SiC films, and GaAs films. Examples of conductive films include Al films, Mo films, and ITO films. Therefore, suitable targets include Si, $MgF_2$, Mo, ITO, Al, Ta, Ti, SiC, and GaAs.

Examples of gas to be introduced through the sputtering gas introducing tube include $H_2$ gas, He gas, Ne gas, and Ar gas. Examples of gas introduced through the reactive gas introducing tube when forming a Si compound film, such as a silicon nitride film or silicon oxide film, include $N_2$ gas, $O_2$ gas, $H_2$ gas, and a fluoride gas.

The substrate for film deposition using the deposition apparatus of the present invention may be a conductive substrate, an electrically insulating substrate, or a semiconductor substrate. Examples of these include polycarbonate, plastic lenses, glasses and glass having a conductive film.

FIG. 2 is a cross sectional view of the second embodiment of the deposition apparatus in accordance with the present invention. It differs from the deposition apparatus of the first embodiment in that RF electrical power is further applied to the supporting member 203. Referring to FIG. 2, reference numeral 211 denotes a high frequency power supply for applying high frequency electrical power to the supporting member.

FIG. 3 is a cross sectional view of the third embodiment of the deposition apparatus in accordance with the present invention. It differs from the deposition apparatus of the first embodiment in that high frequency electrical power, instead of direct current electrical power, is applied to the target electrode. Referring to FIG. 3, reference numeral 308 denotes a high frequency power supply for applying high frequency electrical power to the target electrode.

FIG. 4 is a cross sectional view of the fourth embodiment of the deposition apparatus in accordance with the present invention. It differs from the deposition apparatus of the third embodiment in that a plurality of target electrodes are used. Referring to FIG. 4, reference numeral 405 denotes the plurality of targets.

The present invention will now be described in detail with reference to specific examples. The present invention, however, is not limited to these examples.

EXAMPLE 1

The deposition apparatus of FIG. 1 was used to deposit a silicon nitride film for a magneto-optic disk. Polycarbonate (PC) was used for the substrate 102, with the substrate having a diameter of 3.5 inches and a heat resistance temperature of 60° C. Silicon (Si) was used for the target electrode 105.

The substrate 102 was placed on the substrate supporting member 103, and the pressure in the deposition chamber 101 was reduced down to $10^{-6}$ Torr through an exhaust system (not shown). Argon (Ar) gas was introduced into the deposition chamber 101 from the first gas-introducing tube 106, while $N_2$ gas was introduced into the deposition chamber from the second gas-introducing tube 107, so as to keep the pressure in the chamber at 5 mTorr.

Then, a 3 kW electrical power, generated from a 2.45 GHz microwave power supply (not shown), was introduced into the deposition chamber 101 from the circular waveguide 110 with slots via the dielectric 109 in order to generate plasma. The direct current power supply 108 applied a voltage to the target electrode 105 in order to start sputtering, whereby a silicon nitride film was deposited onto the surface of the substrate 102.

EXAMPLE 2

The deposition apparatus of the first embodiment was used to deposit a magnesium fluoride film for preventing reflection of a lens.

A plastic convex lens with a diameter of 50 mm was used as the substrate 102, while $MgF_2$ was used for the target electrode 105.

The substrate 102 was placed on the substrate supporting member 103, and the pressure in the deposition chamber 101 was reduced down to $10^{-6}$ Torr through an exhaust system (not shown). Argon (Ar) gas was introduced into the deposition chamber 101 from the first gas-introducing tube 106, while $NF_3$ was introduced into the deposition chamber from the second gas-introducing tube 107, so as to keep the pressure in the chamber at 5 mTorr.

Then, a 3 kW electrical power, generated from a 2.45 GHz microwave power supply (not shown), was introduced into the deposition chamber 101 from the circular waveguide 110 with slots via the dielectric 109 in order to generate plasma. The direct current power supply 108 applied a voltage to the target electrode 105 in order to start sputtering, whereby the magnesium fluoride film was deposited onto the surface of the substrate 102. An excellent film with low absorption was deposited, since the plasma ion has low energy and is kept high density.

EXAMPLE 3

The deposition apparatus of FIG. 2 was used to deposit an aluminum (Al) film onto a liquid crystal display substrate.

A glass substrate was used as the substrate 202, while Al was used for the target electrode 205.

The substrate 202 was placed on the substrate supporting member 203, and the pressure in the deposition chamber 201 was reduced down to $10^{-6}$ Torr through an exhaust system (not shown).

Argon (Ar) gas was introduced into the deposition chamber 201 from the second gas-introducing tube 207, so as to keep the pressure in the deposition chamber 201 at 3 mTorr.

A 3 kW electrical power, generated by a 2.45 GHz microwave power supply (not shown), was introduced into the deposition chamber 201 from the circular waveguide 210 with slots via the dielectric 209. In addition, a high frequency bias voltage was applied to the substrate 202 by the RF power supply 211. Further, a voltage was applied to the target electrode 205 from the direct current power supply 208 in order to start sputtering, whereby the Al film was formed on the surface of the substrate 102.

EXAMPLE 4

The deposition apparatus of FIG. 1 was used to deposit a molybdenum film onto a liquid crystal display substrate.

A glass substrate was used as the substrate 102, while molybdenum (Mo) was used for the target electrode 105.

The substrate 102 was placed on the substrate supporting member 103, and the pressure in the deposition chamber 101 was reduced down to $10^{-6}$ Torr via an exhaust system (not shown). Argon (Ar) gas was introduced into the deposition chamber 101 from the second gas introducing tube 107, so as to keep the pressure in the deposition chamber 101 at 3 mTorr.

A 3 kW electrical power, generated by a 2.45 GHz microwave power supply (not shown), was introduced into the deposition chamber 101 from the circular waveguide 110 with slots through the dielectric 109 in order to generate plasma. In addition, a voltage was applied to the target electrode 105 from the direct current power supply 108 in order to start sputtering, whereby the molybdenum film was deposited onto the surface of the substrate 102.

EXAMPLE 5

The deposition apparatus of FIG. 1 was used to deposit an ITO film onto a liquid crystal display substrate.

A glass substrate having formed thereon a color filter and a protective layer for the filter was used as the substrate 102, while ITO was used for the target electrode 105.

The substrate 102 was placed on the substrate supporting member 103, and the pressure in the deposition chamber 101 was reduced down to $10^{-6}$ Torr via an exhaust system (not shown). Argon gas was introduced into the deposition chamber 101 from the first gas introducing tube 106, while $O_2$ gas was introduced into the deposition chamber 101 from the second gas introducing tube 107, so as to keep the pressure in the deposition chamber 101 at 5 mTorr.

A 3 kW electrical power, generated from a 2.45 GHz microwave power supply (not shown), was introduced into the deposition chamber 101 from the circular waveguide 110 with slots via the dielectric 109. In addition, a voltage was applied to the target electrode 105 from the direct current power supply 108 in order to start sputtering, whereby the ITO film was deposited onto the surface of the substrate 102.

EXAMPLE 6

The deposition apparatus of FIG. 1 was used to deposit a polycrystalline silicon film onto a liquid crystal display substrate.

A glass substrate was used as the substrate 102, while silicon was used for the target electrode 105.

The substrate 102 was placed on the substrate supporting member 103, and the pressure in the deposition chamber 101 was reduced down to $10^{-6}$ Torr through an exhaust system (not shown) Argon gas was introduced into the deposition chamber 101 from the second gas introducing tube 107, so as to keep the pressure in the deposition chamber 101 at 10 mTorr.

A 3 kW electric power, generated from a 2.45 GHz microwave power supply (not shown), was introduced into the deposition chamber 101 from the circular waveguide 110 with slots through the dielectric 109 in order to generate plasma. In addition, a voltage was applied to the target electrode 105 by the direct current power supply 108 in order to start sputtering, whereby the polycrystalline silicon film was deposited onto the surface of the substrate 102. A highly crystalline, polycrystalline film was deposited, since the plasma ion has low energy and is kept high density.

EXAMPLE 7

The deposition apparatus of FIG. 3 was used to deposit a silicon oxide film onto a liquid crystal display substrate.

A glass substrate having formed thereon an electrode, such as an ITO film or an Al film, was used as the substrate 302, while $SiO_2$ was used for the target electrode 305.

The substrate 302 was placed on the substrate supporting member 303, and the pressure in the deposition chamber 301 was reduced down to $10^{-6}$ Torr through an exhaust system (not shown). Argon gas was introduced into the deposition chamber 301 from the first gas introducing tube 306, while $O_2$ gas was introduced into the deposition chamber 301 from the second gas introducing tube 307, so as to keep the pressure in the deposition chamber 301 at 5 mTorr.

A 3 kW electric power, generated by a 2.45 GHz microwave power supply (not shown), was introduced into the deposition chamber from the circular waveguide 310 with slots through the dielectric 309. In addition, a high frequency voltage was applied to the target electrode 305 from the RF power supply 308 in order to start sputtering, whereby the silicon oxide film was deposited on the surface of the substrate 302.

EXAMPLE 8

The deposition apparatus of FIG. 4 was used to deposit a tantalum oxide film onto a liquid crystal display substrate.

A glass substrate having formed thereon an electrode, such as an ITO film or an Al film, was used as the substrate 402, while tantalum was used for the target electrode 405.

The substrate 402 was placed on the substrate supporting member 403, and the pressure in the deposition chamber 401 was reduced down to $10^{-6}$ Torr through an exhaust system (not shown). Argon gas was introduced into the deposition chamber 101 from the first gas introducing tube 406, while $O_2$ was introduced into the deposition chamber 401 from the second gas introducing tube 407, so as to keep the pressure in the deposition chamber 401 at 3 mTorr.

A 3 kW electrical power, generated from a 2.45 GHz microwave power supply (not shown), was introduced into the deposition chamber 401 from the circular waveguide 410 with slots via the dielectric 409 in order to generate plasma. In addition, a high frequency voltage was applied to the target electrode 405 by the RF power supply 408 in order to start sputtering, whereby the tantalum oxide film was deposited onto the surface of the substrate 402.

What is claimed is:

1. A deposition apparatus comprising:

a deposition chamber containing a holder for holding a substrate and an electrode holding a sputtering target;

means for applying electrical power to said electrode;

gas supplying means for supplying gas to said deposition chamber;

evacuating means for evacuating said deposition chamber; and microwave supplying means disposed around said deposition chamber;

wherein said microwave supplying means comprises an endless, circular waveguide disposed around a space formed between said target and said holder that oppose each other; and wherein said gas supplying means comprises a sputtering gas supplying means used for introducing a sputtering gas into the vicinity of the target, and a reactive gas supplying means used for introducing a reactive gas into the vicinity of the substrate.

2. A deposition apparatus according to claim 1, wherein a plurality of said targets are provided.

3. A deposition apparatus according to claim 1, wherein the electrical power applied to said electrode is either direct current electrical power or high-frequency electrical power.

4. A deposition apparatus according to claim 1, wherein the electrical power applied to said holder is either direct current electrical power or high-frequency electrical power.

5. A deposition apparatus according to claim 1, wherein at least said second gas supplying means is formed from a dielectric tube.

6. A deposition apparatus according to claim 1, wherein said target is composed of one of the materials selected from the group consisting of Si, $MgF_2$, Mo, ITO, Al, Ta, Ti, SiC, and GaAs.

7. A deposition apparatus according to claim 1, further comprising means for applying electrical power to said holder.

* * * * *

UNITED STATES PATENT AND TRADEMARK OFFICE
CERTIFICATE OF CORRECTION

PATENT NO.   : 5,975,012
DATED        : November 2, 1999
INVENTOR(S)  : SENICHI HAYASHI ET AL.

It is certified that error appears in the above-identified patent and that said Letters Patent is hereby corrected as shown below:

<u>COLUMN 5</u>:

Line 50, "shown)" should read --shown).--.

<u>COLUMN 8</u>:

Line 2, "second" should read --reactive--.

Signed and Sealed this

Sixth Day of March, 2001

Attest:

NICHOLAS P. GODICI

*Attesting Officer*    *Acting Director of the United States Patent and Trademark Office*